United States Patent
Tsai et al.

(10) Patent No.: US 6,633,126 B1
(45) Date of Patent: Oct. 14, 2003

(54) PLASMA DISPLAY PANEL (PDP) STRUCTURE

(75) Inventors: Tzeng-Shii Tsai, Hsinchu (TW); Yu-Kai Lin, Hsinchu (TW)

(73) Assignee: Acer Display Technology, Inc., Hsinchu (TW)

( * ) Notice: Subject to any disclaimer, the term of this patent is extended or adjusted under 35 U.S.C. 154(b) by 519 days.

(21) Appl. No.: 09/690,938

(22) Filed: Oct. 17, 2000

(30) Foreign Application Priority Data

Jan. 19, 2000 (TW) .......................................... 089200935

(51) Int. Cl.⁷ ............................................... H01J 17/49
(52) U.S. Cl. ......................................... 313/582; 313/46
(58) Field of Search ................................. 313/582–587, 313/493, 46

(56) References Cited

U.S. PATENT DOCUMENTS 5,971,566 A * 10/1999 Tani et al. .................. 362/294
6,198,222 B1 * 3/2001 Chang ........................ 313/582
6,288,489 B1 * 9/2001 Isohata et al. .............. 313/582
6,476,883 B1 * 11/2002 Salimes et al. ............... 349/58

* cited by examiner

Primary Examiner—Robert H. Kim
Assistant Examiner—Jurie Yun
(74) Attorney, Agent, or Firm—Birch, Stewart, Kolasch & Birch, LLP

(57) ABSTRACT

The present invention relates to a plasma display panel, including a front glass substrate, a rear glass substrate, a rod, a base plate, and a screw. The rear glass substrate includes a first plane and a second plane, wherein the first plane is connected with the front glass substrate. The rod is adherent to the rear glass substrate by means of an adhesive. The base plate is tightly connected with the rear glass substrate, wherein an integrated protrusion is formed on the base plate at a location corresponding to the rod. An accommodation space is formed between the protrusion and the rear glass substrate to accommodate the rod, and the screw is provided to lock the rod onto the base plate.

12 Claims, 6 Drawing Sheets

PLASMA DISPLAY PANEL (PDP) STRUCTURE

FIELD OF THE INVENTION

The present invention relates to a structure of a plasma display panel (PDP).

BACKGROUND OF THE INVENTION

The related prior art has been disclosed in J.P. Pat. No. 10-260641.

As disclosed in the aforementioned J.P. Pat. No. 10-260641, the plasma display panel (PDP) as known in the prior art includes a panel and a base plate in general. The panel has a front glass substrate and a rear glass substrate, which form a closed space together. A plurality of discharge units is arranged in the closed space for illumination. Because the electrical function of the discharge units is not related to the present invention, it is not discussed here accordingly. Please refer to U.S. Pat. No. 5,436,634 for its further illustration. Besides, the base plate of the plasma display panel of the aforementioned prior art comprises aluminum, and it is connected with the panel by an adhesive which is usually a very high bond (VHB) or a double-sided adhesive tape.

FIG. 6 illustrates another method to assemble the plasma display panel. The base plate is connected with the panel by means of a rod 35 and the very high bond (VHB) 37. According to the prior art, the base plate 30 is connected with the rod 35 by a screw 32, while the rear glass substrate 38 is connected with the rod 35 by the very high bond (VHB) 37. A space (not shown) is formed between the front glass substrate 39 and the rear glass substrate 38, and the two substrates are combined to form a panel. The rest of the components of the prior art as shown in FIG. 6 include a flexible printed circuit (FPC) 36, a stand-off 31, and a chip-on-board (COB) 34, wherein the rear glass substrate 38 is connected with the flexible printed circuit 36, the flexible printed circuit 36 is connected with the chip-on-board 34, and the stand-off 31 is located between the chip-on-board 34 and the base plate 30. A plurality of IC components and a plurality of driving circuits on the chip-on-board 34 are used to drive corresponding electrodes on the panel to generate a desired image. The flexible printed circuit 36 is a flexible circuit to primarily provide conducting wires as electric signal connections among the electrodes on the panel, the IC components on the chip-on-board 34, and the driving circuits on the chip-on-board 34. The stand-off 31 is provided to fix the chip-on-board 34 and to separate the chip-on-board 34 from the base plate 30. The above details are related to the prior art.

According to the prior art indicated in FIG. 6, the base plate 30 and the rear glass substrate 38 are not able to completely adhere to each other. It has the following disadvantages:

(1) the entire plasma display panel is too thick;
(2) the heat generated from the rear glass substrate 38 is not allowed to be dissipated from the entire base plate, and therefore the heat dissipating efficiency is not desirable, and it causes a huge temperature difference over the entire surface of the plasma display panel;
(3) the equality of the temperature distribution over the rear glass substrate 38 is not desirable, which means that the heat is not equally distributed; and
(4) the effect of illumination of the entire display panel is not good enough, and the displaying performance becomes worse.

SUMMARY OF THE INVENTION

According to the aforementioned disadvantages of the prior art, a plasma display panel introduced in the present invention provides the following improvements:

(1) the entire plasma display panel becomes thinner;
(2) the temperature distribution may be uniform over the plasma display panel;
(3) almost the entire base plate is well connected with the rear glass substrate, and the heat is therefore well dissipated; and
(4) because the temperature of the rear glass substrate drops and the heat is more uniformly distributed, the effect of illumination over each section of the display panel is more desirable, and the displaying performance becomes better.

The plasma display panel of the present invention includes a front glass substrate, a rear glass substrate, a rod, a base plate, and a screw, wherein the rear glass substrate is connected with the front glass substrate, and the rod is connected with the rear glass substrate by means of an adhesive. The base plate is well adherent to the rear glass substrate, and it includes an integrated protrusion at a location corresponding to the rod. An accommodation space is formed between the protrusion and the rear glass substrate to accommodate the rod. The screw is provided to lock the rod onto the base plate. The adhesive is a very high bond made of a heat conducting material in order to connect the rod with the rear glass substrate.

The plasma display panel of the present invention may further include a heat conducting layer between the base plate and the rear glass substrate. The heat conducting layer may be a metal foil adherent to the back surface of the rear glass substrate for heat conducting purpose. The heat conducting layer may also be made of a flexible material with heat dissipating capability, such as heat conducting rubber, attached to the back of the rear glass substrate for heat conducting and buffering purpose.

The plasma display panel of the present invention may further include a heat conducting layer between the rod and the protrusion on the base plate. As the base plate is adherent to the rear glass substrate, the rod may be tightly connected with the protrusion on the base plate, which makes it easier to lock the rod onto the base plate by means of the screw. The heat conducting layer is made of a flexible material with heat conducting capability, such as heat conducting rubber.

Another preferred embodiment of the present invention includes a front glass substrate, a rear glass substrate, a rod, a base plate, a washer, and a screw. Wherein the rear glass substrate is connected with the front glass substrate, and the rod is connected with the rear glass substrate by means of an adhesive. The base plate is divided into two portions both well adherent to the rear glass substrate, and an accommodation space is formed between the two sections of the base plate to accommodate the rod. The washer may be connected with the two portions of the base plate and the rod at the same time, and the screw may lock the rod onto the base plate with the washer. The washer is made of a heat dissipating material for heat conducting and buffering purpose, and the adhesive used to connect the rod with the rear glass substrate is a very high bond made of a heat conducting material.

DETAIL DESCRIPTION OF THE PRESENT INVENTION

Figure 1:
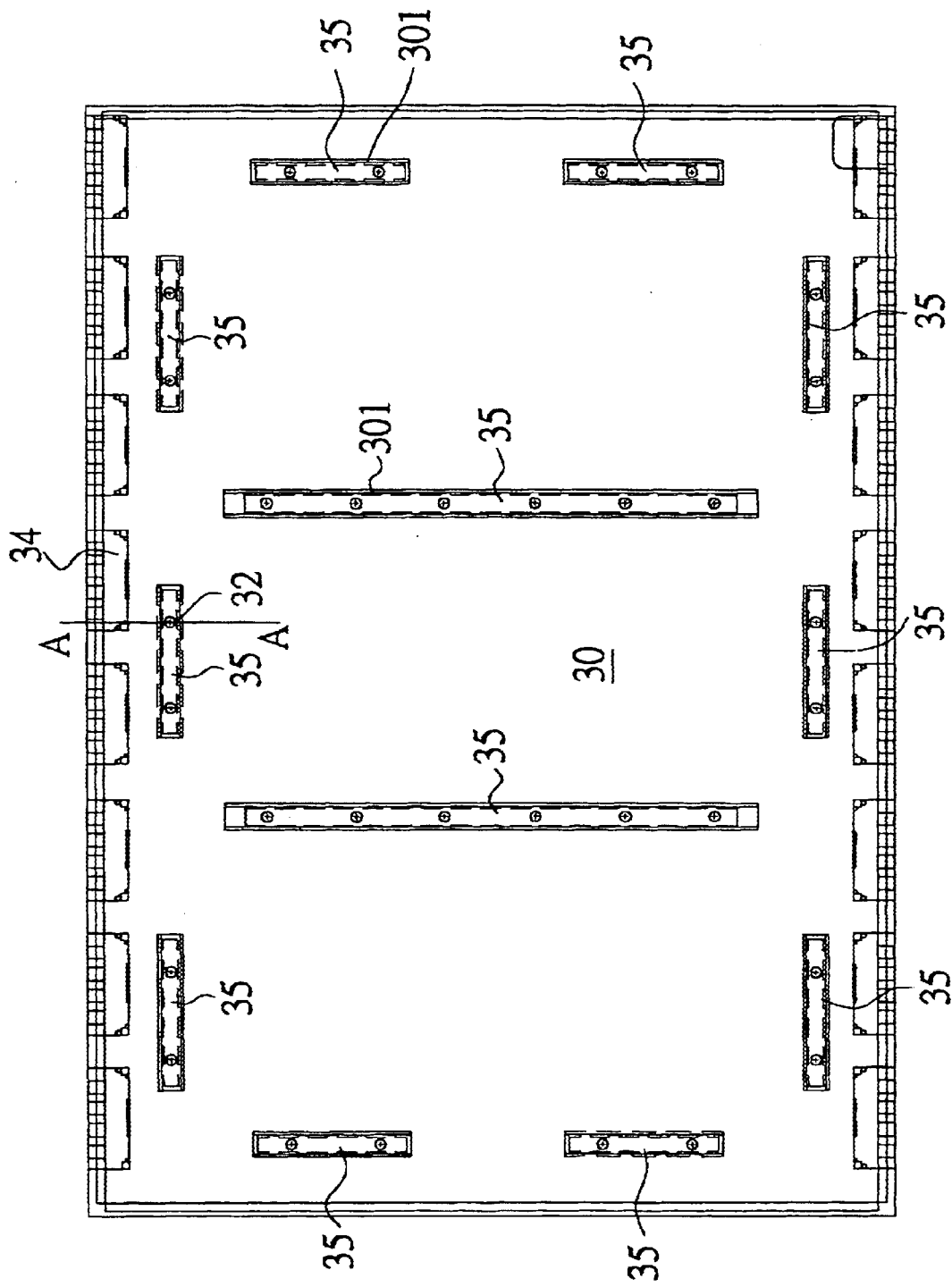
FIG. 1 illustrates a rearview of the frame before connected with the plasma display panel according to the first preferred embodiment, including a rod 35, a base plate 30, a chip-on-board 34 and a screw 32.
Figure 2:
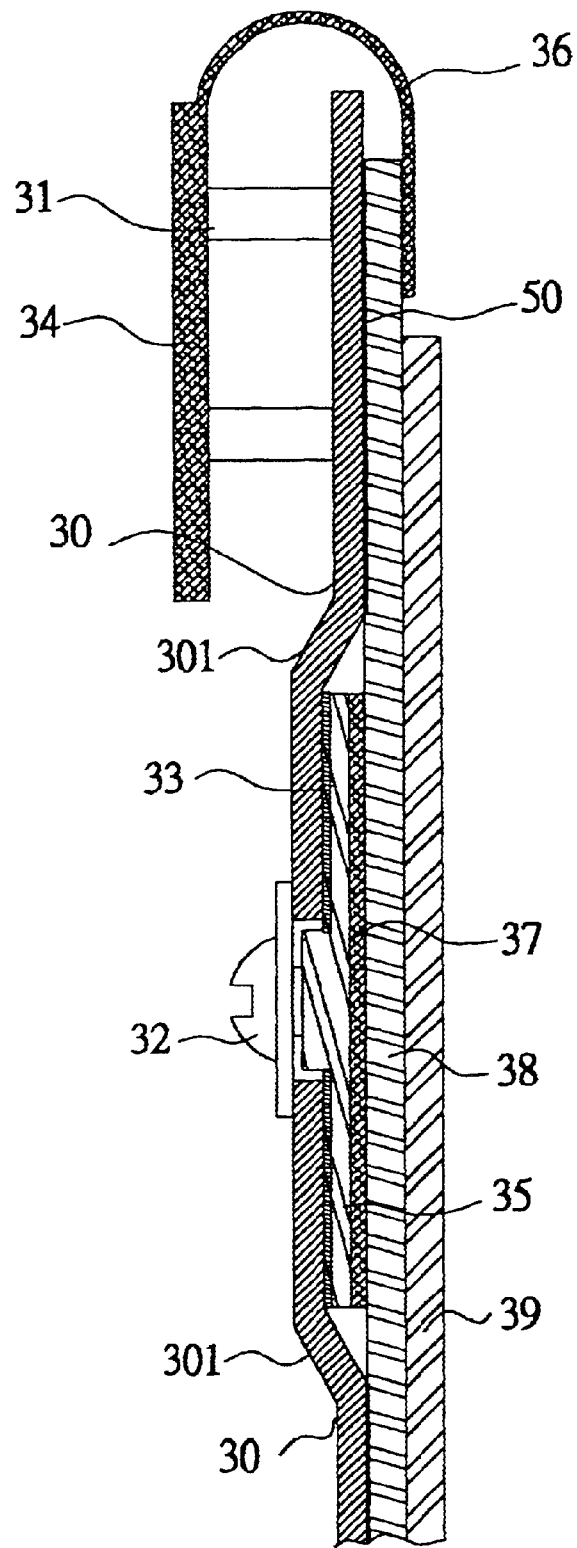
FIG. 2 illustrates a profile according to the first preferred embodiment along a hatch A—A indicated in FIG. 1.

The first preferred embodiment as illustrated in FIG. 1 and FIG. 2 indicates the display panel including a front glass substrate 39, a rear glass substrate 38, and a base plate 30. A closed space is formed between the front glass substrate and the rear glass substrate. The base plate 30 is connected with the rod 35 by means of a screw 32; while the rod 35 is connected with the rear glass substrate 38 by means of an adhesive 37. The adhesive is a very high bond made of a heat conducting material to improve the heat dissipating efficiency.

In order to solve the problems existing in the prior art, an integrated protrusion 301 is formed on the base plate 30 of the present invention, at a location corresponding to the rod 35. An accommodation space is formed between the protrusion 301 and the rear glass substrate 38 to accommodate the rod 35. Because the protrusion 301 is formed on the base plate 30, it is the only portion which is not completely adherent to the rear glass substrate 38. The rest of the portions on the base plate 30 are well adherent to the rear glass substrate 38, and it is easier to dissipate the heat from the rear glass substrate.

As shown in FIG. 2, in order to further dissipate the heat from the rod 35, a first heat conducting layer 33 may be selectively disposed between the protrusion 301 and the rod 35 on the base plate 30. The first heat conducting layer 33 is made of a conducting buffer. The conducting buffer helps to conduct the heat from the rod 35 to the protrusion 301, and some of the heat may therefore be dissipated from the protrusion 301. This makes the present invention have a better heat dissipating efficiency. The first heat conducting layer 33 may be made of a flexible material with heat dissipating capability, such as heat conducting rubber.

As shown in FIG. 2, to further dissipate the heat, a second heat conducting layer 50 may be selectively disposed between the base plate 30 and the rear glass substrate 38. The second heat conducting layer 50 may be a heat conducting copper foil which is substantially 0.1 mm thick. The heat conducting copper foil helps to conduct the heat from the rear glass substrate 38 to the base plate 30 more efficiently, and it helps to achieve a better heat dissipating efficiency. Besides, the second heat conducting layer 50 may be made of a flexible material with heat dissipating capability, such as heat conducting rubber, so that it may be used for heat conducting and buffering purpose. The second heat conducting layer 50 may also be a double-layer structure made of a heat conducting copper foil and a flexible material with heat dissipating capability, such as heat conducting rubber, so that the present invention may have a better heat dissipating efficiency and a shockproof effect in the mean time.

To sum up, the surface of the rear glass substrate 38 is defined to have the first portion surface 102 and the second portion surface 104. The rod 35 is connected with the first portion surface of the glass substrate 38 by an adhesive 37. The heat conducting layer 50 is disposed on the second portion surface of the glass substrate 38. The base plate 30 has an accommodation space 110 formed at the location corresponding to the rod 35. The connecting device is disposed above the accommodation space for connecting the rod 35 with the base plate 30. When the rod 35 is connected with the base plate 30, the accommodation space accommodates the rod 35 to offset the height of the rod 35 to make at least a portion of the base plate 30 in contact with the heat conducting layer 50.

According to the aforementioned design, the present invention has the following advantages:

(1) most of the base plate 30 is well adherent to the rear glass substrate 38 so that the entire panel is thinner;

(2) the heat generated from the rear glass substrate 38 may be dissipated from a vast area connected with the base plate 30, so that the present invention has a better heat dissipating efficiency;

(3) the temperature uniformity of the rear glass substrate 38 is better; and (4) because of the existing of the rod 35, it is easier to disassemble the base plate 30 when maintaining the panel.

It is to be emphasized that in the first preferred embodiment, the first heat conducting layer 33 and the second heat conducting layer 50 may be selectively left out.

Figure 3:
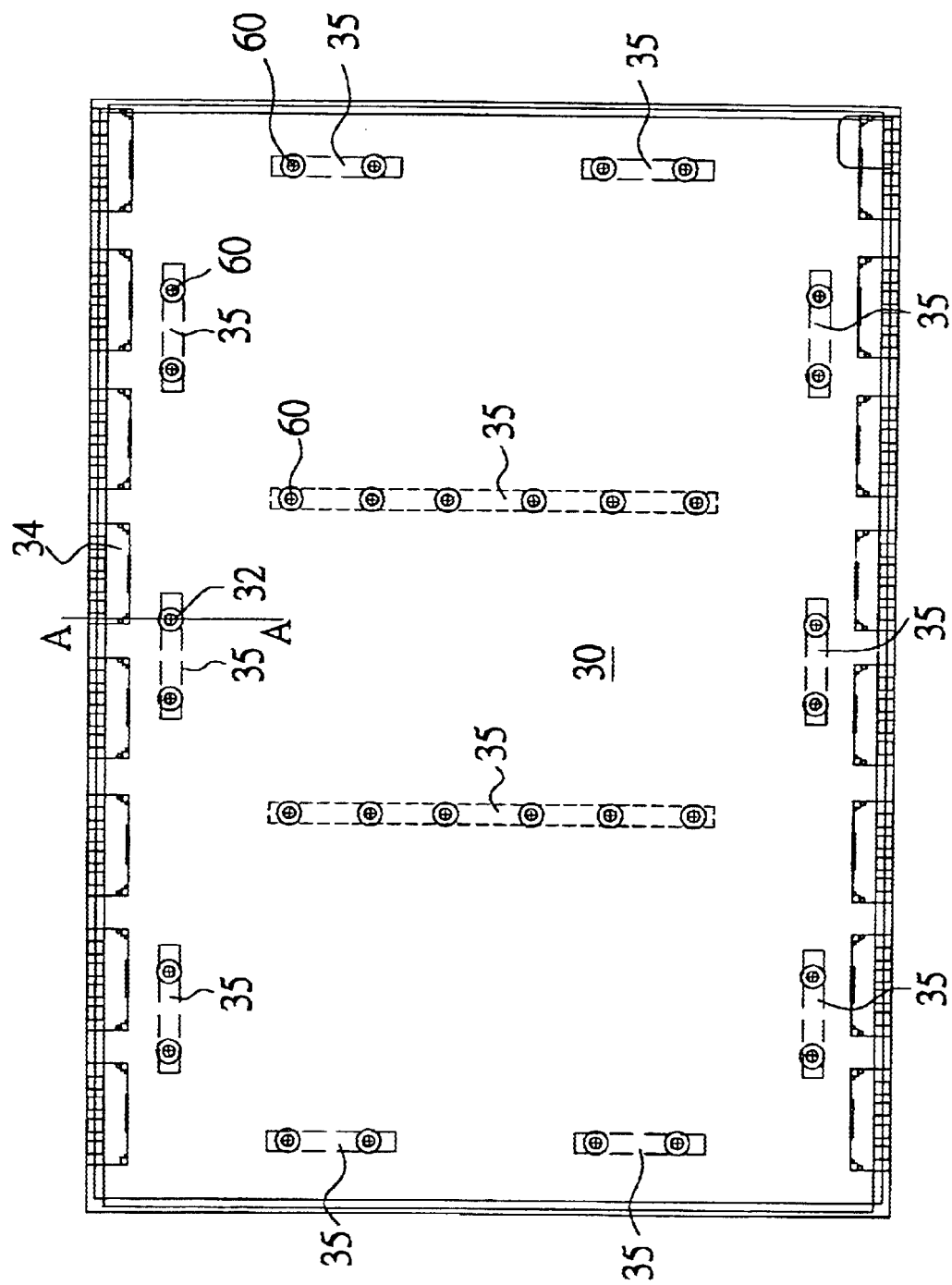
FIG. 3 illustrates a rearview of the frame before connected with the plasma display panel according to the second preferred embodiment.
Figure 4:
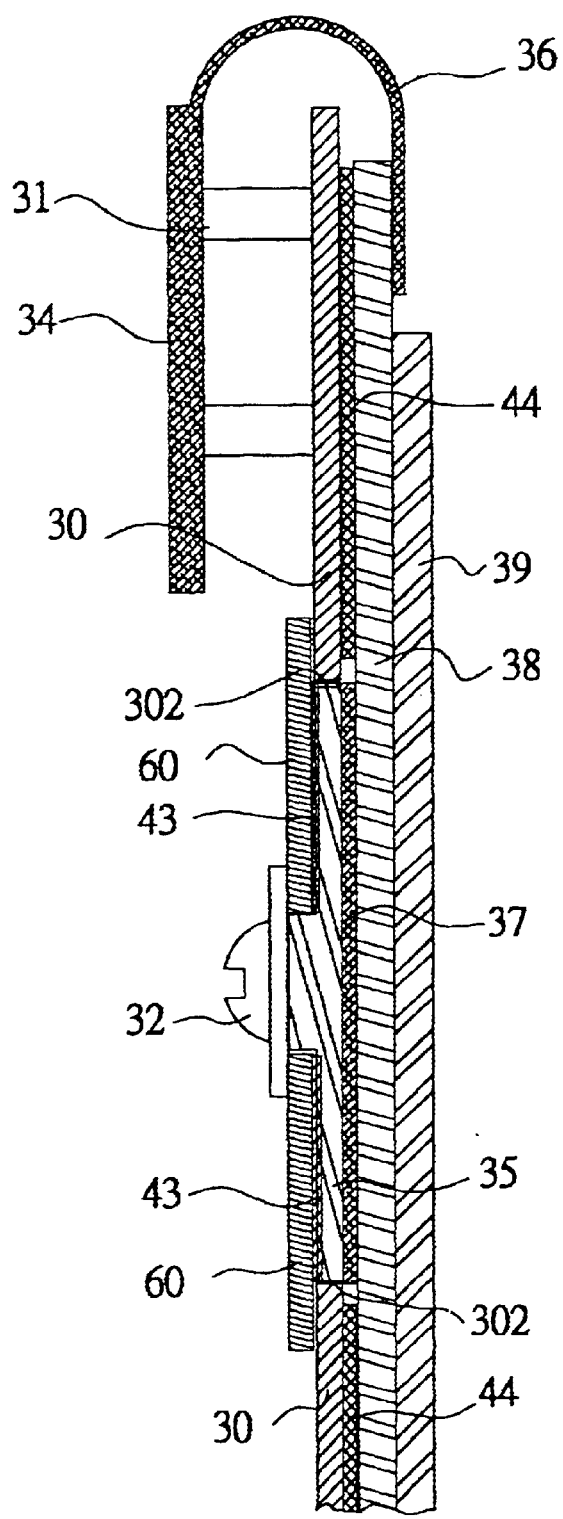
FIG. 4 illustrates a profile according to the second preferred embodiment along a hatch A—A indicated in FIG. 3.

The second preferred embodiment of the present invention is shown in FIG. 3 and FIG. 4. The plasma display panel of the present invention includes a front glass substrate 39, a rear glass substrate 38, and a base plate 30. A closed space is formed between the front and the rear glass substrates. In order to tightly connect the base plate with the rear glass substrate, an opening 302 is provided on the base plate 30 to accommodate the rod 35, and the rod 35 is adherent to the rear glass substrate 38 by means of a very high bond 37. The present invention further includes a washer 60, and the washer 60 is connected with the rod 35 by means of a screw 32. Because the diameter of the washer 60 is longer than the diameter of the opening 302 on the base plate, one may push the bottom surface of the washer 60 against the edge of the opening 302 on the base plate to make the base plate 30 well adhere to the rear glass substrate. It is to be emphasized that the washer 60 may be selectively left out when the nut of the screw 32 is expanded to cover the opening and cover a portion of the base plate 30.

The second embodiment as shown in FIG. 4 is similar to the first preferred embodiment. To further dissipate the heat from the rod 35, a third heat conducting layer 43 may be selectively disposed between the washer 60 and the rod 35 on the base plate 30. The conducting buffer helps to conduct the heat from the rod 35 to the washer 60, and some of the heat may therefore be dissipated from the washer 60. It makes the present invention have a better heat dissipating efficiency. A fourth heat conducting layer 44 may also be selectively disposed between the base plate 30 and the rear glass substrate 38.

Because both the base plate 30 and the washer 60 are made of a material with heat dissipating capability, the heat dissipating route of the rear glass substrate 38 may be described hereinafter:

(1) for the adherent portion between the base plate 30 and the rear glass substrate 38, the heat generated from the rear glass substrate 38 may be dissipated from the base plate 30 by heat conducting; and (2) for the adherent portion between the rear glass substrate 38 and the rod 35, the heat generated from the rear glass substrate 38 may be dissipated from the rod 35 and the washer 60 by heat conducting.

Figure 5:
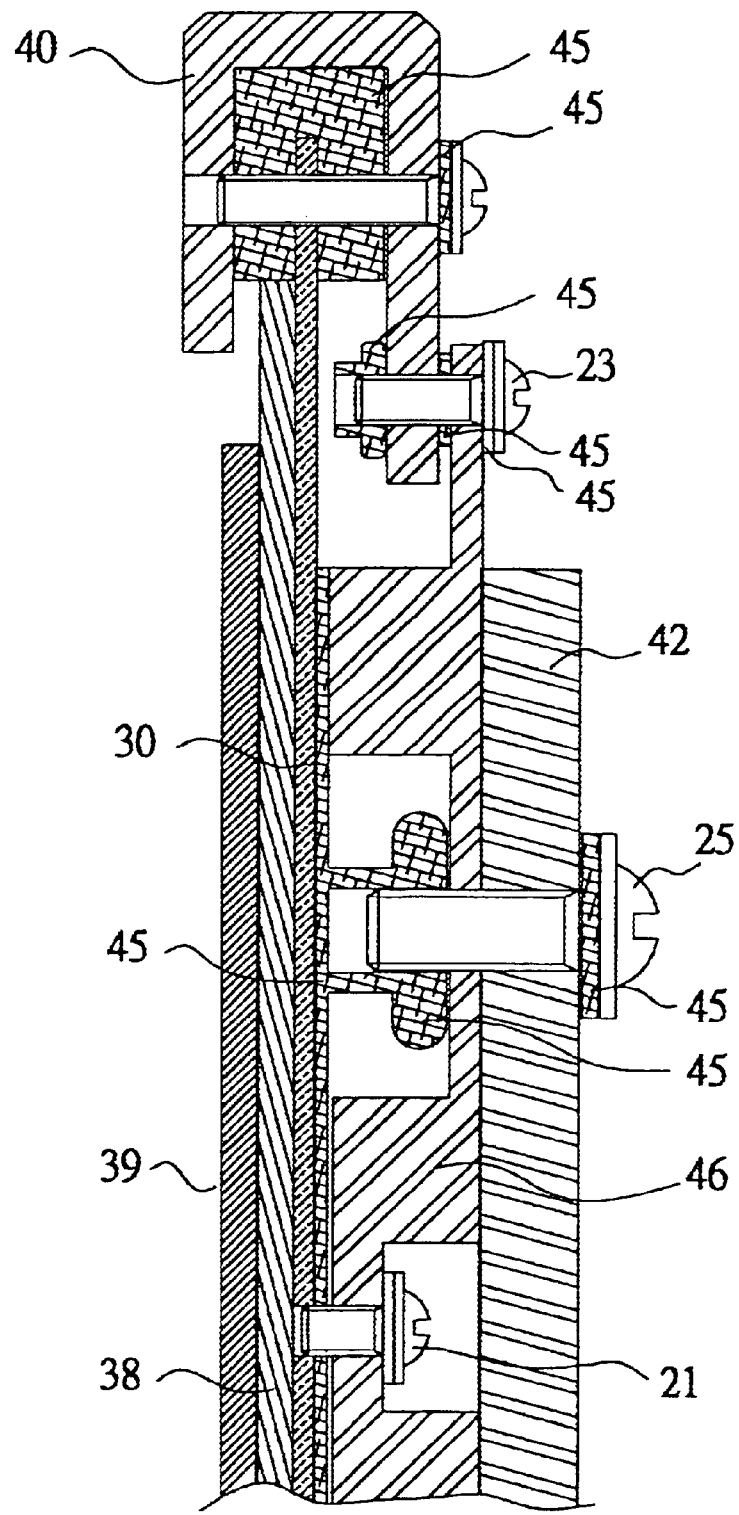
FIG. 5 illustrates a partial profile of the frame 40 after connected with the plasma display panel, including a support base 42, a screw 25, a support bar 46 and a buffering layer 45.
Figure 6:
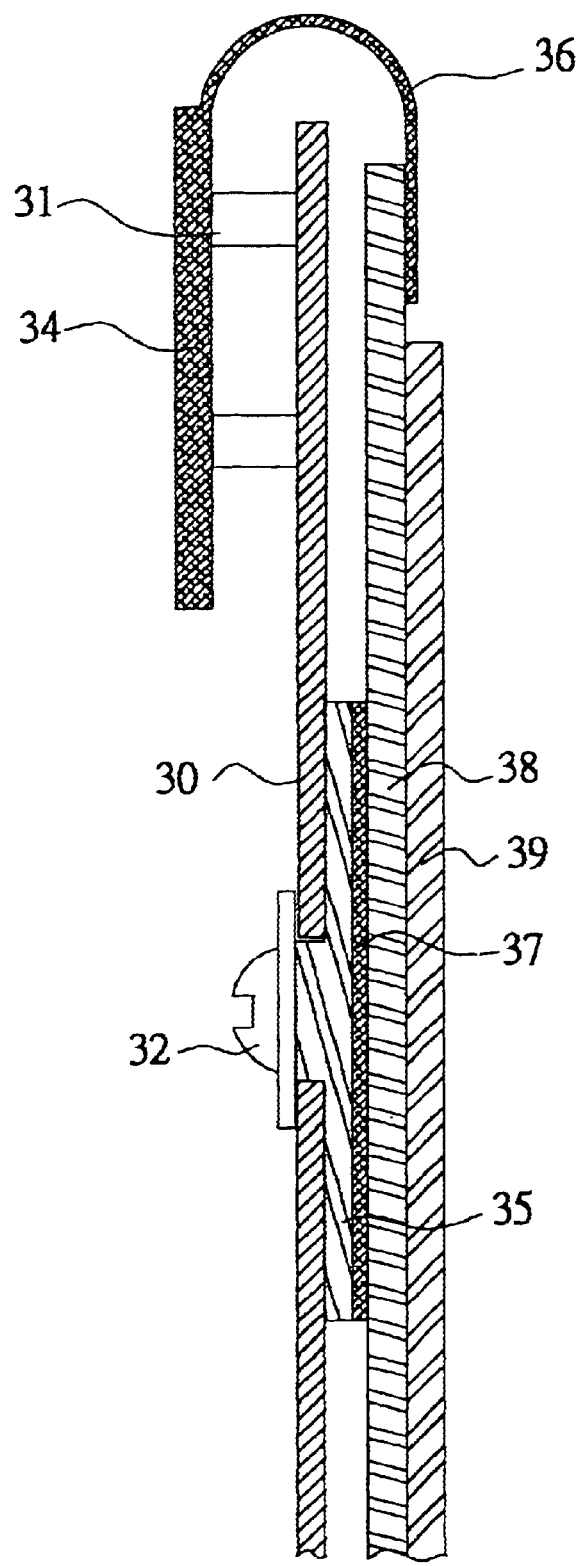
FIG. 6 illustrates a profile of the prior art.

After assembling the display panel according to the aforementioned first preferred embodiment or the second preferred embodiment, connect the base plate 30 of the display panel with a support bar 46 by means of the screw 21 as shown in FIG. 5. Next, connect the support bar 46 with the frame 40 by means of the screw 23, and assemble the support bar 46 and the support base 42 by means of the screw 25. The buffering layer 45 is primarily provided for each component to be tightly connected with one another and to absorb shaking energy during vibration. The buffering layer 45 may also be made of a heat conducting material to improve the heat dissipating efficiency.

What is claimed is:

1. A plasma display panel, comprising:
   a glass substrate, said glass substrate having a first portion surface and a second portion surface;
   a rod, connected with said first portion surface of said glass substrate by an adhesive;
   a heat conducting layer disposed on said second portion surface of said glass substrate;
   a base plate, including an accommodation space formed at a location corresponding to said rod; and
   a connecting device, disposed above said accommodation space for connecting said rod with said base plate,
   wherein when said rod is connected with said base plate, said accommodation space accommodates said rod to make at least a portion of said base plate in contact with said heat conducting layer.

2. The plasma display panel according to claim 1, wherein said base plate comprises a hollow protrusion, as said base plate is connected with said glass substrate, said accommodation space is formed between said hollow protrusion of said base plate and said glass substrate.

3. The plasma display panel according to claim 1, wherein said base plate comprises an opening, as said base plate is connected with said glass substrate, said accommodation space is formed by said opening.

4. The plasma display panel according to claim 1, wherein said adhesive is a very high bond (VHB) composed of a heat conducting material.

5. The plasma display panel according to claim 1, wherein said heat conducting layer is a metal foil adherent to said glass substrate for heat conducting purpose.

6. The plasma display panel according to claim 1, wherein said heat conducting layer is a flexible material with heat dissipating capability, and is adherent to said glass substrate for heat conducting and buffering purpose.

7. The plasma display panel according to claim 2, wherein a heat conducting layer is disposed between said rod and said protrusion of said base plate, as said base plate is connected with said glass substrate, said rod may dissipate heat by means of said protrusion of said base plate.

8. The plasma display panel according to claim 7, wherein said heat conducting layer is composed of a flexible material with heat dissipating capability.

9. The plasma display panel according to claim 3, wherein a conducting layer is disposed between said rod and said connecting device, as said base plate is connected with said glass substrate, said rod may dissipate heat by means of said connecting device.

10. The plasma display panel according to claim 9, wherein said heat conducting layer is composed of a flexible material with heat dissipating capability.

11. The plasma display panel according to claim 1, wherein said connecting device is a screw.

12. The plasma display panel according to claim 1, wherein said connecting devices comprise a screw and a washer.

* * * * *